United States Patent
College

(10) Patent No.: US 7,073,696 B2
(45) Date of Patent: Jul. 11, 2006

(54) HIGH REPEATABILITY TAPE FEEDER FOR ELECTRONIC COMPONENT CARRIER TAPES

(75) Inventor: David Alan College, Annville, PA (US)

(73) Assignee: Tyco Electronics Corporation, Middletown, PA (US)

(*) Notice: Subject to any disclaimer, the term of this patent is extended or adjusted under 35 U.S.C. 154(b) by 92 days.

(21) Appl. No.: 10/723,956

(22) Filed: Nov. 24, 2003

(65) Prior Publication Data

US 2005/0109466 A1    May 26, 2005

(51) Int. Cl.
   *B65G 20/00* (2006.01)
   *B65G 20/22* (2006.01)
   *B65H 23/18* (2006.01)

(52) U.S. Cl. .................. 226/139; 226/188; 226/32; 226/45

(58) Field of Classification Search .......... 226/2, 226/45, 32, 82, 128, 139, 138, 110, 188, 80; 242/564.4, 564.3
   See application file for complete search history.

(56) References Cited

U.S. PATENT DOCUMENTS

| | | | |
|---|---|---|---|
| 4,549,680 A | 10/1985 | Brown | |
| 4,586,670 A | 5/1986 | Vancelette et al. | |
| 4,735,341 A | 4/1988 | Hamilton et al. | |
| 4,820,369 A | 4/1989 | Kubo | |
| 4,838,452 A | 6/1989 | Hamilton et al. | |
| 4,869,393 A | 9/1989 | Soth | |
| 4,887,778 A | 12/1989 | Soth et al. | |
| 4,923,089 A | 5/1990 | Hineno et al. | |
| 5,020,959 A | 6/1991 | Soth | |
| 5,024,720 A * | 6/1991 | Boss et al. | 156/584 |
| 5,116,454 A | 5/1992 | Kurihara | |
| 5,191,693 A | 3/1993 | Umetsu et al. | |
| 5,339,939 A | 8/1994 | Gueble et al. | |
| 5,531,859 A | 7/1996 | Lee et al. | |
| 5,725,140 A | 3/1998 | Weber et al. | |
| 5,865,359 A | 2/1999 | Kanai | |
| 5,941,674 A | 8/1999 | Briehl | |
| 6,032,845 A | 3/2000 | Piccone et al. | |
| 6,082,603 A | 7/2000 | Takada et al. | |
| 6,082,954 A | 7/2000 | Foster | |
| 6,139,246 A | 10/2000 | Briehl | |
| 6,162,007 A | 12/2000 | Witte | |
| 6,179,189 B1 * | 1/2001 | Otoshi | 226/32 |
| 6,179,190 B1 | 1/2001 | Kim | |
| 6,196,783 B1 | 3/2001 | Foster | |
| 6,318,437 B1 | 11/2001 | Yoo et al. | |
| 6,368,045 B1 | 4/2002 | Ashman et al. | |
| 6,402,452 B1 | 6/2002 | Miller et al. | |
| 6,427,320 B1 | 8/2002 | Seto et al. | |
| 6,474,527 B1 * | 11/2002 | Miller | 226/32 |

(Continued)

FOREIGN PATENT DOCUMENTS

DE   WO 02080643   * 10/2002

Primary Examiner—Kathy Matecki
Assistant Examiner—Evan Langdon

(57) ABSTRACT

A tape feeder for precisely advancing a component-carrying tape to present sequential electronic components disposed at a pitch in the tape to a pick-and-place machine. A feed sprocket and an encoder disc are operatively associated with each other and rotatably disposed on a common axis within a housing. A motor is operatively connected to the feed sprocket to repetitively rotate the feed sprocket over an angle corresponding to the pitch of the component-carrying tape. An encoder is disposed to read the encoder disc and provide a feedback signal indicating the angular position of the feed sprocket.

15 Claims, 3 Drawing Sheets

U.S. PATENT DOCUMENTS 6,631,868 B1 * 10/2003 Miller et al. ................. 242/563
6,857,546 B1 * 2/2005 Saho ........................... 226/188
2003/0127487 A1 * 7/2003 Liebeke ....................... 226/188
2004/0094594 A1 * 5/2004 Liebeke ........................ 226/32

* cited by examiner

HIGH REPEATABILITY TAPE FEEDER FOR ELECTRONIC COMPONENT CARRIER TAPES

FIELD OF THE INVENTION

The present invention relates generally to the field of surface mount assembly machines and more particularly to a tape feeder providing highly repeatable and accurate advancement of a component-carrying tape.

BACKGROUND OF THE INVENTION

In the surface mount assembly field, component-carrying tapes are used to store and deliver electronic components for use in populating circuit boards or other substrates using surface mount processes. These component-carrying tapes have pockets sequentially arranged along the length of the tape for carrying various electronic components and perforations along an edge of the tape for use in advancing the tape. The distance between the pockets is referred to as the pitch of the tape. A tape feeder is typically used to provide automated delivery of the components to surface mount equipment, such as a pick-and-place machine. The tape feeder typically comprises a feed sprocket that engages the perforations in the tape, a motor to provide a driving force, a drive train to transfer force from the motor to the sprocket, and a control system to control the rotation of the motor and consequently, the advancement and positioning of the tape.

Surface mount components continue to get smaller, and, in order to increase efficiency, it is desirable to decrease the pitch (i.e., the space between pockets in the tape). Smaller components and reduced pitch require more precise positioning of the tape by the tape feeder so that the pick-and-place machine, which has a small head, can pick up the components. Existing tape feeders, however, often lack the precision and repeatability to accurately present these smaller components typically having dimensions of 0.04 inches or less. Also, tape feeders designed to handle small components and small pitch sizes are typically complex and costly to produce.

SUMMARY OF THE INVENTION

In an exemplary embodiment of the invention, a tape feeder precisely advances a component-carrying tape to present sequential electronic components disposed at a pitch in the tape to a pick-and-place machine. In the exemplary tape feeder, a feed sprocket, and an encoder disc are operatively associated with each other and rotatably disposed on a common axis. A motor is operatively connected to the feed sprocket to repetitively rotate the feed sprocket over an angle corresponding to the pitch of the component-carrying tape. An encoder is disposed to read the encoder disc and provide a feedback signal indicating the angular position of the feed sprocket.

BRIEF DESCRIPTION OF THE DRAWINGS

The invention is described below with reference to the accompanying drawings, of which.

DETAILED DESCRIPTION OF THE PREFERRED EMBODIMENT

Figure 1:
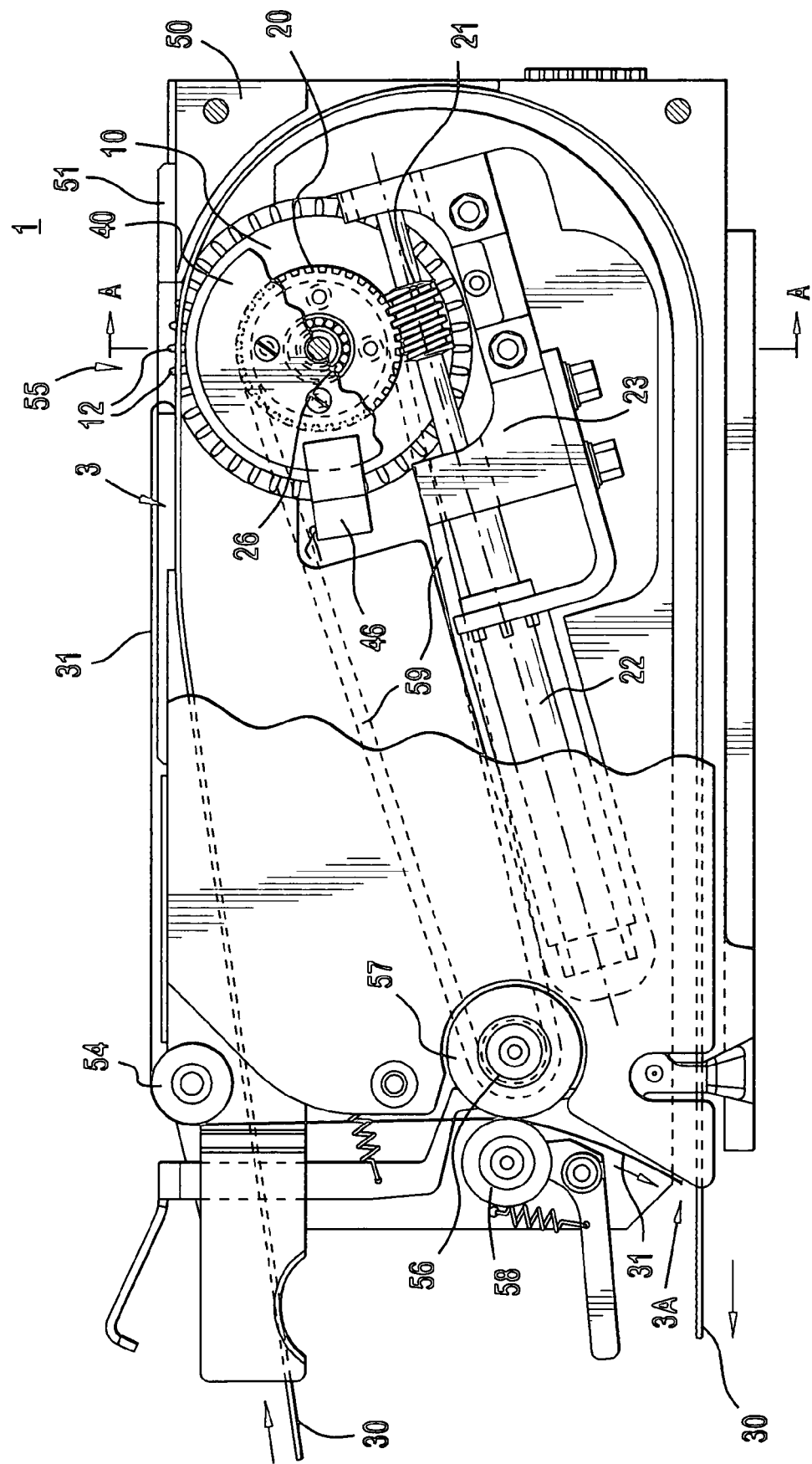
FIG. 1 is a side view, partially in section, showing a tape feeder according to an exemplary embodiment of the invention.
Figure 2:
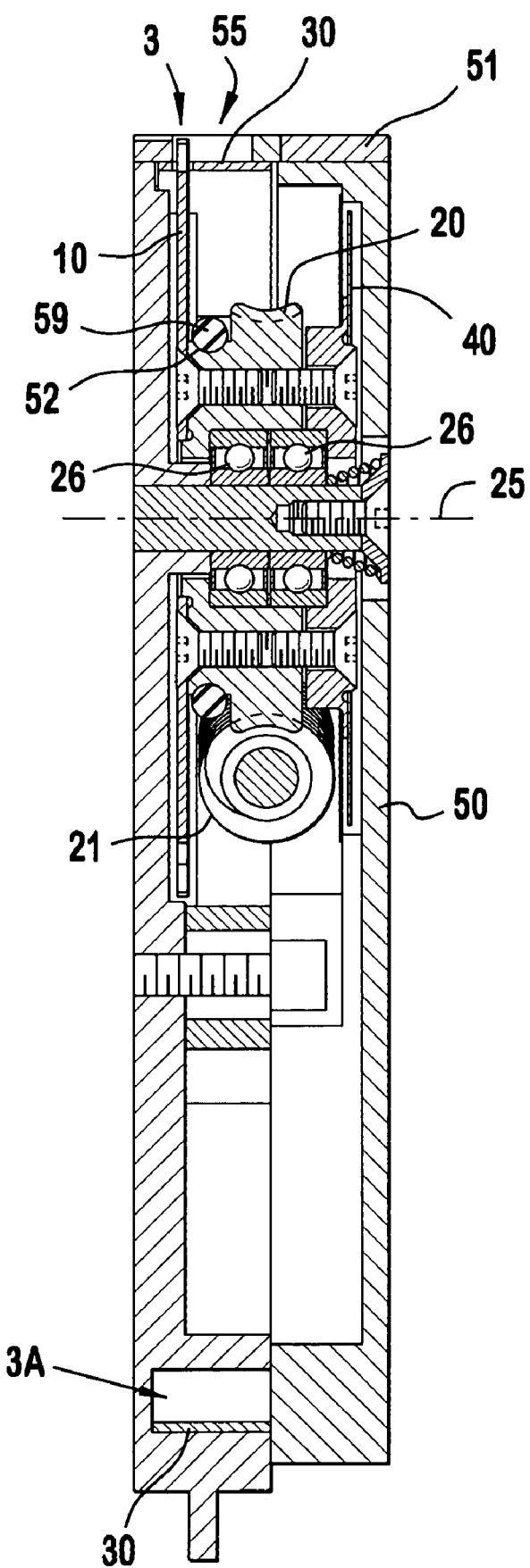
FIG. 2 is a sectional view of the tape feeder of FIG. 1 taken generally along axis A—A shown in FIG. 1.

The present invention is a tape feeder 1 with a low complexity architecture that drives a component-carrying tape 30 by engaging perforations (not shown) along an edge of the component-carrying tape 30, providing component positioning that is highly accurate and repeatable. Referring to FIGS. 1 and 2, in an exemplary embodiment of the invention, a feed sprocket 10 is attached to a worm gear 20 that rotates around a fixed axis 25 (shown in FIG. 2) on a pair of ball bearings 26. The ball bearings 26 are spring loaded and biased in the axial direction to remove radial and axial play. The feed sprocket 10 comprises a plurality of teeth 12 disposed around its periphery, such that the arc length between the teeth 12 is essentially equal to the spacing between the perforations in the edge of the component-carrying tape 30. The feed sprocket 10 may, for example, be mounted on a hub of the worm gear 20 or attached to a side face of the worm gear 20. Feed sprocket 10 and worm gear 20 are operatively associated with each other, such that they rotate together about the axis 25 defined by the ball bearings 26.

The feed sprocket 10 and worm gear 20 are mounted in a housing 50. The feed sprocket 10 and the worm gear 20 are positioned with respect to the upper tape feed track 3 such that the teeth 12 engage the feed holes in the component-carrying tape 30 riding in the upper tape feed track 3. The upper tape feed track 3 is formed in the housing 50 to guide the component-carrying tape 30. Upper tape feed track 3 directs the tape 30 over the feed sprocket 10 at a window 55 where components are removed from the tape 30. After the components are removed, the empty tape 30 is guided through a lower tape feed track 3A where the emptied tape 30 exits the tape feeder 1.

The worm gear 20 is driven by a worm shaft 21 mounted by a pair of ball bearings (not shown) in a worm shaft mounting block 23 and coupled to a DC gear motor 22. The mounting of the worm shaft 21 and motor 22 assembly is adjustable to limit backlash between the worm shaft 21 and worm gear 20. This adjustment is made by sliding the worm shaft mounting block 23 toward the worm gear 20 and keeping its right surface against the mating surface on the housing to maintain the square relationship of the worm shaft 21 and worm gear 20. When the location of zero backlash is found, two screws are inserted through the worm mounting block 23 to lock the block and thus the worm shaft 21 in place. DC power is selectively provided to the motor 22 to rotate the worm gear 20 and feed sprocket 10, and thereby advance the component-carrying tape 30. DC power is discontinued to maintain the position of the worm gear 20 and the feed sprocket 10, and thereby stop the component-carrying tape 30 so that a pick-and-place machine can remove a component from the component-carrying tape 30. Thus, the angular position of the worm gear 20 and the feed sprocket 10 are controlled by applying and interrupting power to the motor 22.

An encoder disc 40 is mounted to the worm gear 20 via a hub to rotate together with the sprocket 10 and the worm gear 20 on the same ball bearing axis. The encoder disc 40 is operatively associated with the worm gear 20 and feed sprocket 10, such that its angular position is consistent with the angular positions of the worm gear 20 and feed sprocket 10. An encoder 46 is mounted in the housing 50 and positioned to read the encoder disc 40.

Figure 3:
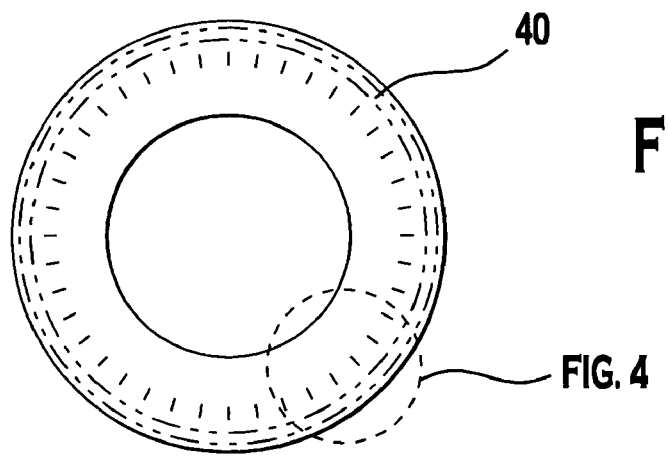
FIG. 3 shows an encoder disc according to an exemplary embodiment of the invention.
Figure 4:
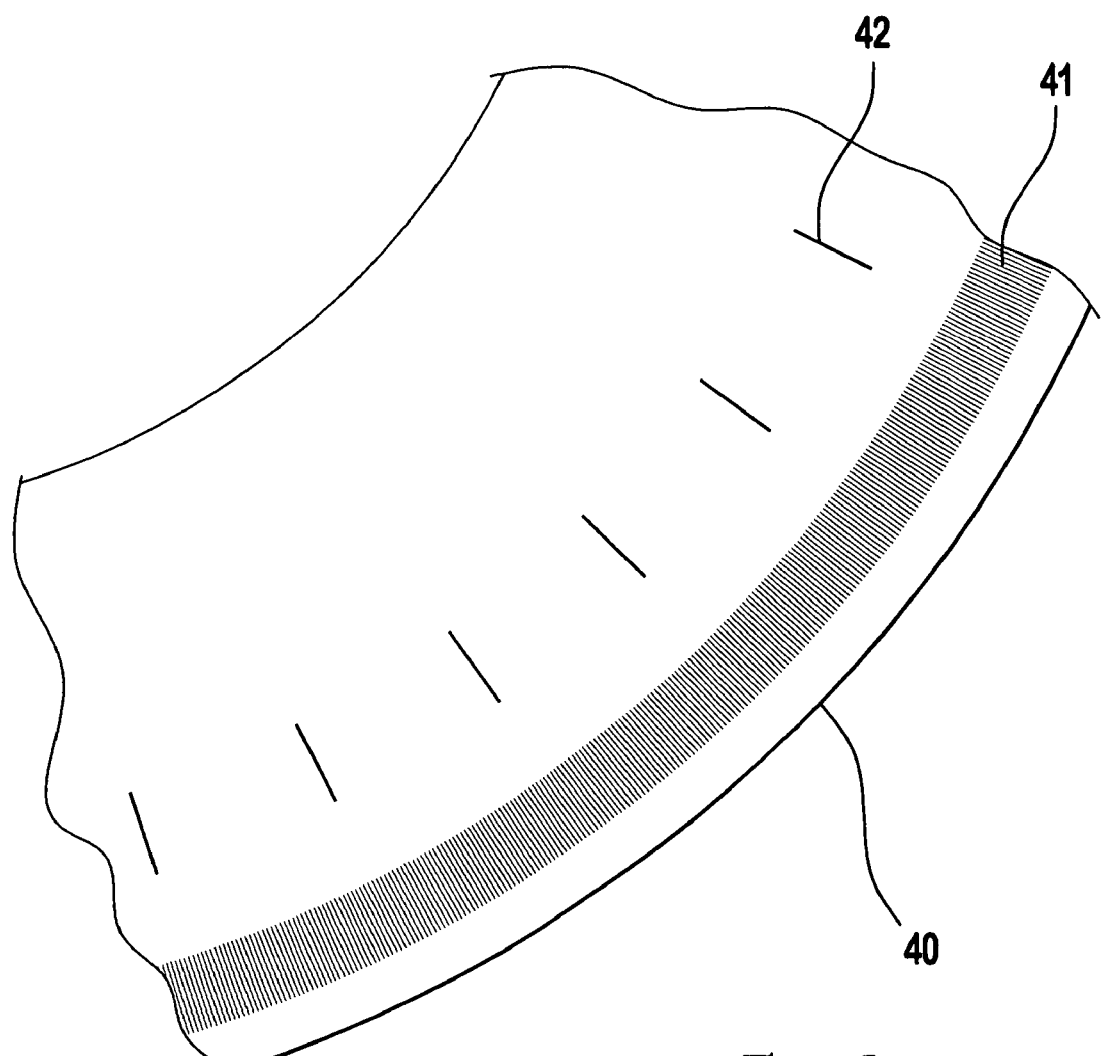
FIG. 4 shows a detailed view of the encoder disc of FIG. 3.

As shown in FIGS. 3 and 4, the encoder disc 40 has a primary ring of finely spaced lines 41 on a face of the encoder disc 40, extending radially at essentially equal angular intervals. The lines 41 are read by the encoder 46, which generates an electronic pulse that is used to interpret the angular position of the encoder disc 40. Quadrature output can be used to multiply the number of encoder pulses into a higher number of "counts" to improve position resolution. The angular position of the worm gear 20 and feed sprocket 10 are equivalent to the angular position of the encoder disc 40, and are therefore also determined by the encoder 46. The encoder disc 40 has a very large number of lines 41, substantially more lines than there are teeth on the feed sprocket (e.g., more than ten times as many lines as teeth, and preferably about 2500 distinct, essentially equally spaced lines). The substantially greater number of lines 41 enable very precise measurement of the angular position of the encoder disc 40 and therefore, the angular position of the operatively associated feed sprocket 10. From a plurality of angular position measurements, the angular velocity of the feed sprocket 10 can be determined, and therefore, the speed and position of the component-carrying tape 30 can be precisely determined.

Optionally, a secondary ring with a relatively smaller number of equally spaced lines 42, as compared to the number of lines 41, may be provided on the encoder disc 40. The number of lines 42 matches the typical number of feed strokes accomplished by one complete revolution of the feed sprocket 10. These lines 42 may be used as a reference point on the feed sprocket 10 after each feed stroke.

A processor (not shown), such as a microcomputer, can count the electronic pulses or "counts" that are generated by the encoder 46 as a result of the lines 41 passing the encoder 46. By counting the lines 41 from a known start-point (e.g., lines 42), the processor can monitor the feed sprocket position and use software to control the motor 22 to effect an exact and repeatable sprocket feed. An improvement in precision is gained by having the encoder 46 on the axis of the feed sprocket 10, rather than on the motor 22, as is typical. Also, because the encoder disc 40 can use lines 42 as a known start point for each feed stroke, cumulative errors from successive feed strokes can be prevented. Additionally, because the closely spaced lines 41 can be used to accurately determine the position and angular velocity of the feed sprocket 10, the DC power to the motor 22 can be discontinued at the appropriate time to compensate for hysteresis in the motor 22 and worm gear 20.

Referring again to FIGS. 1 and 2, a tape cover plate 51 forms a portion of the housing 50 positioned over the upper tape feed track 3 to retain the tape 30 in operative engagement with the feed sprocket 10. As described above, the components on the component-carrying tape 30 can be accessed through the window 55 by a pick-and-place head (not shown) of an assembly machine. To access the components, a thin cover tape 31 must be removed from the component-carrying tape 30. When the tape 30 is first loaded, the cover tape 31 is peeled back from the tape 30 in the window 55 and threaded around a pulley 54 to a pull-off wheel 56 which is turning opposite from the direction of travel of the component-carrying tape 30. On the outer diameter of the pull-off wheel 56, a tire 57 is in frictional contact with the cover tape 31. The tire 57 is composed of a resilient material, such as urethane. The cover tape 31 is pulled off of the component-carrying tape 30 and back by rotating the pull-off wheel 56. The pull-off wheel 56 may be rotated, for example, by a belt 59, which transmits power from the worm gear 20. The belt 59 rides in a groove 52 on a hub of the worm gear 20 and is coupled to pull-off wheel 56. A spring wheel 58 is biased toward the tire 57, pressing the cover tape 31 into the tire 57 to ensure that the tire 57 adequately grips the cover tape 31 being pulled and expelled.

The foregoing illustrates some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range of equivalents.

What is claimed is:

1. A tape feeder for advancing a component-carrying tape to present sequential electronic components disposed in the tape at a pitch for assembly, the tape feeder comprising:
   a feed sprocket having a number of teeth thereon and an encoder disc operatively associated with each other and rotatably disposed on a common axis;
   a motor operatively connected to the feed sprocket to repetitively rotate the feed sprocket over an angle corresponding to the pitch of the component-carrying tape;
   an encoder disposed to read the encoder disc and provide a feedback signal indicating the angular position of the feed sprocket; and
   the encoder disc having two rings of lines, the first ring having a line spacing corresponding to the pitch of the component-carrying tape, and the second ring having a line spacing less than the pitch of the component-carrying tape and substantially greater than the number of teeth on the feed sprocket.

2. The tape feeder of claim 1 further comprising a worm gear operatively associated with the feed sprocket and encoder disc and rotatably disposed on their common axis to impart angular velocity of the worm gear to the feed sprocket and the encoder disc.

3. The tape feeder of claim 2 further comprising a worm shaft coupled to the motor and engaged with the worm gear.

4. The tape feeder of claim 2 wherein the feed sprocket and the encoder disc are attached to the worm gear.

5. The tape feeder of claim 4 wherein the feed sprocket and the encoder disc are fastened to a hub of the worm gear.

6. The tape feeder of claim 1 wherein an upper tape feed track directs the component-carrying tape into engagement with the feed sprocket.

7. The tape feeder of claim 6 further comprising a housing, wherein the upper tape feed track is formed in the housing and the motor, feed sprocket and encoder disc are mounted in the housing.

8. The tape feeder of claim 7 wherein the housing has a window formed therein positioned in communication with the upper tape feed track to allow removal of components from the component-carrying tape.

9. The tape feeder of claim 8 wherein the window is positioned proximate the engagement of the feed sprocket and the component-carrying tape.

10. The tape feeder of claim 1 wherein the second ring has about 2500 lines.

11. The tape feeder of claim 1 wherein the axis of rotation of the worm gear is defined by a pair of ball bearings.

12. The tape feeder of claim 11 wherein the ball bearings are biased in the axial direction to remove radial and axial play.

13. The tape feeder of claim 1 wherein the second ring has a number of lines which is at least 10 times greater than the number of teeth.

14. The tape feeder of claim 13 wherein the encoder has a quadrature output to multiply a number of encoder pulses into a higher number of counts.

15. The tape feeder of claim 13 wherein angular position and speed of the feed sprocket are determined by an output of the encoder reading the two rings of lines on the encoder disc.

* * * * *